United States Patent [19]

Verhoeven et al.

[11] Patent Number: 4,849,034
[45] Date of Patent: Jul. 18, 1989

[54] THERMAL TREATMENT FOR INCREASING MAGNETOSTRICTIVE RESPONSE OF RARE EARTH-IRON ALLOY RODS

[75] Inventors: John D. Verhoeven; O. D. McMasters, Edwin D. Gibson, all of Ames, Iowa

[73] Assignee: Iowa State University Research Foundation, Inc., Ames, Iowa

[21] Appl. No.: 108,492

[22] Filed: Oct. 14, 1987

[51] Int. Cl.$^4$ .............................................. H01F 1/02
[52] U.S. Cl. .............................. 148/100; 75/62 ZM; 75/84
[58] Field of Search ............... 75/65 ZM, 84; 148/100

[56] References Cited

U.S. PATENT DOCUMENTS 4,609,402 9/1986 McMasters .............................. 75/84

OTHER PUBLICATIONS

Clark, Chapter 7, pp. 531–589, in "Ferromagnetic Materials", vol. 1, (Ed E. P. Wohlfarth, North-Holland Pub. Co., 1980), Verhoeven et al., (1987), Met. Trans., 118A:223–231.

*Primary Examiner*—Peter D. Rosenberg
*Attorney, Agent, or Firm*—Tilton, Fallon, Lungmus & Chestnut

[57] ABSTRACT

Magnetostrictive rods formed from rare earth-iron alloys are subjected to a short time heat treatment to increase their Magnetostrictive response under compression. The heat treatment is preferably carried out at a temperature of from 900° to 1000° C. for 20 minutes to six hours.

12 Claims, No Drawings

THERMAL TREATMENT FOR INCREASING MAGNETOSTRICTIVE RESPONSE OF RARE EARTH-IRON ALLOY RODS

CONTRACTUAL ORIGIN OF INVENTION

The U.S. Government has rights in this invention pursuant to Contract No. W-7405-ENG-82 between the U.S. Department of Energy and Iowa State University, Ames, Iowa.

FIELD OF INVENTION

The field of this invention is magnetostrictive alloys and the manufacturing of rods therefrom. This invention is particularly concerned with increasing the magnetostrictive response of rare earth-iron alloy magnetostrictive rods.

BACKGROUND OF INVENTION

In recent years considerable research has been devoted to the development of magnetostrictive compounds, and in particular rare earth-iron alloys. These developments are summarized by A. E. Clark, Chapter 7, pages 531-589, in "Ferromagnetic Materials", Vol. 1 (Ed. E. P. Wohlfarth, North-Holland Pub. Co., 1980). A major objective of the research has been to develop rare earth-iron alloys with large room temperature magnetostriction constants. Technically important alloys having these properties include alloys of terbium together with dysposium and/or holmium. The relative proportions of the rare earths and the iron are varied to maximize room temperature magnetostriction and minimize magnetic anisotropy. Presently, the most technically advanced alloy of this kind is represented by the formula $Tb_xDy_{1-x}Fe_{1.5-2.0}$ wherein x is a number from 0.27 to 0.35. An optimized ratio is $Tb_{0.3}Dy_{0.7}Fe_{1.9}$ which is known as terfenol-D, as described in U.S. Pat. No. 4,308,474.

Such rare earth-iron alloys are true compounds and can exist in crystalline or polycrystalline form. In preparing elongated bodies (viz. rods) from such alloys, grain-orientation of the crystals is essential for achieving high magnetostriction. An axial grain orientation of the crystallites not only increases the magnetostriction constant but also reduces internal losses at the grain boundaries. This is particularly important in applications where a high magnetostriction at low applied fields is required. (See Clark, cited above, pages 545-547).

As cast magnetostrictive rods, such as those formed from the Terfenol-type alloy, can be processed by a "float zone" method, as described in McMasters U.S. Pat. No. 4,609,402. The as-cast rod is subjected to progressive zone melting and re-solidification. In optimized embodiments of this method, the resulting rod is essentially a single elongated crystal extending for the length of the rod. The longitudinally-aligned single crystals have a $<112>$ direction parallel to the growth axis, and twin plane boundaries running perpendicular to the $<\bar{1}\bar{1}>$ direction of the crystal. [See Verhoeven, et al. (1987), Met. Trans., 118A:223-231.] As described by Verhoeven, et el. magentostrictive rods with generally similar properties can be produced by a directional freezing technique in which a liquified column of the alloy is progressively solidified. That procedure results in aligned polycrystals with a $<112>$ direction nearly parallel to the growth axis. Axially-aligned, single crystal rods produced by the float zone method, and axially-aligned polycrystalline rods produced by the zone solidification method exhibit comparable magnetostrictive responses as originally produced.

McMasters U.S. Pat. No. 4,609,402 states that the as-cast float-zone processed rods may be subjected to heat treatment to obtain phase equilibrium (col. 7, lines 16-20). This disclosure reads: "The directionally oriented rods may be heat treated in a vacuum tube furnace chamber to achieve phase equilibria. This was proposed to be accomplished at 950° C. for a period of five days. A slow cool down period, usually overnight, is desirable in order to avoid cracking." These statements were in reference to single crystal-type rods, and there is no suggestion that the phase equilibrium heat treatment would affect magnetostrictive properties.

SUMMARY OF THE INVENTION

The improvement in magnetostrictive properties is obtained by heating the rods to a temperature in the range from 870 to 1100° C. and holding the rod within that temperature range until magnetostrictive response to the rods when axially compressed is substantially increased. The rod is then cooled to ambient room temperature.

The temperature holding to increase magnetostrictive response can be carried out in much less time than required to achieve phase equilibria, viz. holding of the rods at an elevated temperature such as at 950° C. for a period of five days is not required. The benefit of the method of this invention can be obtained with a very short heating time, such as 20 to 30 minutes.

The explanation of why a short time heat treatment improves magnetostrictive response is not known. It does not appear to be related to achieving phase equilibria in the crystalline structure. Furthermore, it is not understood why the improvement is observed primarily when the rods are under axial compression.

DETAILED DESCRIPTION

The method of the present invention is applicable generally to $RFe_x$ alloy magnetostrictive rods, where R is one or more rare-earth metals, Fe is iron, and x is a number from 1.5 to 2.0. In preferred embodiments, the magnetostrictive alloy is formed of iron and terbium (Tb) together with dysprosium (Dy) and/or holmium (Ho). Based on the present state of the art, the Terfenol-type alloys are believed to be optimum. Such alloys are represented by the formula $Tb_xDy_{1-x}Fe_{1.5-2.0}$ wherein x is a number from 0.27 to 0.35. In preparing these alloys, commercial grades of electrolytic iron and purified rare-earth metals are employed. Preferably the metals should have purities of at least 99.9% by weight.

A method for forming and casting magnetostrictive alloy rods is described in McMasters U.S. Pat. No. 4,609,402. After cleaning, the metal constituents are weighed and alloyed by means of a conventional arc-melter. Buttons or fingers thus formed are charged to a melting crucible, and within the crucible there is formed a molten homogeneous body of the rare earth-iron alloy. As described in the cited patent, the molten alloy may be pushed out of the crucible by argon pressure into quartz tubes, and solidified therein to cast the rods.

The "as-cast" rods can be subjected to progressive zone melting and resolidification to obtain an axial grain orientation, and convert the rods to essentially single crystal form. The rods, for example, may be in the form of elongated cylindrical bodies having diameters of 0.5 to 1.2 cm and lengths from 15 to 25 cm. When the as-cast polycrystalline rods are subjected to progressive zone melting, the rods may be aligned vertically with their sides unsupported, and the melt zone may be moved upwardly along the rods from their lower to their upper ends. The size of the melt zone and its rate of upward movement are controlled to maintain the shape of the rod. For further details, reference may be had to the cited patent, which includes an illustration of an apparatus for carrying out the zone melting and resolidification.

Polycrstalline rods for use in the method of this invention can be produced by the directional freezing technique described in Verhoeven, et al. (1987), *Met. Trans.*, 118A:223-231. In that procedure, a liquified column of the alloy is progressively solidified from its lower end to its upper end. This may be done by providing for heat removal of the lower end portion of the flow through the rods. Other details and variations of this directional freezing method are described in co-pending application Ser. No. 25,572, filed Mar. 13, 1987, entitled "Continuous Method for Manufacturing Grain-Oriented Magnetostrictive Bodies".

In general, the method of this invention is applied to magnetostrictive rods as initially formed with an axially-aligned single crystal or axially-aligned polycrystals.

Since heated magnetostrictive alloys are highly reactive, the rods should be protected from chemical reaction while they are being processed. For example, they can be encapsulated in quartz tubes under inert gas or vacuum. Argon or helium are suitable inert gases.

The heating of the rods may be carried out in a suitable furnace, such as an electric resistance furnace. With the rod protected against chemical reaction, such as by the encapsulation procedure described above, the furnace may be gradually heated with the rods inserted therein. This is a preferable procedure to inserting the rods in the furnace which has already been heated to the desired temperature. The more gradual heating tends to protect the crystal structure of the rods. Similarly, after the conclusion of the heat treatment, the furnace may be turned off and allowed to gradually cool down.

In general, the temperature required for the heat treatment is in the range from 870 to 1100° C. The preferred temperature range is from 900 to 1000° C. After the rod has been heated to a temperature within the specified range, it is held at a temperature in the range until the magnetostrictive response of the rod when axially compressed is substantially increased. This can be accomplished with a holding time of as short as 1 to 5 minutes, but usually a holding time of at least 20 to 30 minutes is preferable. However, the holding time need not be as long as required to obtain phase equilibria. For example, holding times in the range from 20 minutes to 6 hours are usually sufficient. While a longer holding time can be used, the temperature holding of the rods can be completed in all cases in less than 24 hours.

The method of this invention and the results obtainable are further illustrated by the following experimental examples.

EXPERIMENTAL EXAMPLES

Two samples were prepared as follows: (1) A Terfenol $Tb_{0.3}Dy_{0.7}Fe_{1.9}$ alloy as-cast rod was processed by float melting and resolidification to produce a twinned single crystal with a <112> direction parallel to the growth axis (diameter=6 mm, length =5 cm.); and (2) A Terfenol $Tb_{0.3}Dy_{0.7}Fe_{1.9}$ rod was prepared by directional solidification to produce aligned polycrystals with a <112> direction nearly parallel to the growth axis (diameter - 8 mm, length=5 cm).

The sample rods were encapsulated in tantalum containers under an argon atmosphere and placed inside of argon-containing quartz tubes. The encapsulated rods were heated to 950° C., held 1 hour, and the air cooled. The magnetostrictive parameters of the rods before and after heat treatment are compared below in Table A.

TABLE A

| | Magnetostrictive Parameters of Terfenol Rods Before and After Heat Treatment (HT) | | | |
|---|---|---|---|---|
| | P = O ksi[3] | | P = 2 ksi[3] | |
| Sample | λ(2.5, P)[1] | λ/H(max)[2] | λ(2.5, P) | λ/H(max) |
| Before HT | | | | |
| Single crystal | 1140 ppm | 1.40 ppm/Oe | 1680 ppm | 1.10 ppm/Oe |
| Aligned Poly-Crystal | 980 ppm | 1.18 ppm/Oe | 1600 ppm | 1.20 ppm/Oe |
| After HT | | | | |
| Single Crystal | 860 ppm | 1.1 ppm/Oe | 1940 ppm | 2.64 ppm/Oe |
| Aligned Poly-Crystal | 970 ppm | 2.2 ppm/Oe | 1765 ppm | 1.95 ppm/Oe |

[1]λ is the axial magnetostrictive strain in ppm at 2.5 kOe and pressure, P.
[2]H is the magnetic field, and λ/H is the ratio of strain to field strength in ppm/Oe.
[3]Axial compression in ksi.

As can be seen from the data in Table A, heat treatment appreciably improved the magnetostrictive response in both the single crystal and aligned polycrystalline rods under axial compression of 2 ksi. When the rods were uncompressed (0 ksi), the observed magnetostrictive responses were of the same order after heat treatment as before heat treatment.

We claim:
1. The method of increasing the magnetostrictive response of an $RFe_x$ alloy magnetostrictive rod under compression wherein R is one or more rare earth metals, Fe is iron, and x is a number from 1.5 to 2.0, said rod being essentially in an axially-aligned single crystalline form, comprising the steps of heating said rod to a temperature in the range from 870 to 1100° C., holding said rod in said temperature range until the magnetostrictive response of said rod when axially compressed is substantially increased, and cooling said rod to ambient room temperature, said temperature holding step being carried out in less than the time required to achieve phase equilibria and being completed in less than 24 hours.

2. The method of increasing the magnetostrictive response of a rod under compression formed from a magnetostrictive alloy of iron and terbium (Tb) together with other rare earth metal selected from the group consisting of dysprosium (Dy), holmium (Ho), or both Dy and Ho, said rod being essentially in the form of a longitudinally aligned single crystal comprising the steps of:
 (a) heating said rod to a temperature in the range from 900 to 1000° C.;
 (b) holding said rod in said temperature range for 20 minutes to 6 hours; and
 (c) cooling said rod to ambient room temperature, said steps being carried out while protecting said rod from chemical reaction.

3. The method of claim 2 in which said magnetostrictive alloy is represented by the formula $Tb_xDy_{1-x}Fe_{1.5-2.0}$ wherein x is a number from 0.27 to 0.35.

4. The method of claim 2 in which said magnetostrictive alloy is represented by the formula $Tb_{0.3}Dy_{0.7}Fe_{1.9}$.

5. The method of increasing the magnetostrictive response of a rod under compression formed from a magnetostrictive alloy or iron and terbium (Tb) together with other rare earth metal selected from the group consisting of dysprosium (Dy), holmium (Ho), or both Dy and Ho, said rod being essentially in an axially-aligned polycrystalline form comprising the steps of:
   (a) heating said rod to a temperature in the range from 900 to 1000° C.;
   (b) holding said rod in said temperature range for 20 minutes to 6 hours; and
   (c) cooling said rod to ambient room temperature, said steps being carried out while protecting said rod from chemical reaction.

6. The method of claim 5 in which said magnetostrictive alloy is represented by the formula $Tb_xDy_{1-x}Fe_{1.5-2.0}$ wherein x is a number from 0.27 to 0.35.

7. The method of claim 5 in which said magnetostrictive alloy is represented by the formula $Tb_{0.3}Dy_{0.7}Fe_{1.9}$.

8. The method of increasing the magnetostrictive response of an $RFe_x$ alloy magnetostrictive rod under compression where R is one or more rare earth metals, Fe is iron, and x is a number from 1.5 to 2.0, said rod being essentially in an axially-aligned polycrystalline form, comprising the steps of heating said rod to a temperature in the range from 870 to 1100° C., holding said rod in said temperature range until the magnetostrictive response of said rod when axially compressed is substantially increased, and cooling said rod to ambient room temperature, said temperature holding step being carried out in less than the time required to achieve phase equilibria and being completed in less than 24 hours.

9. The method of claims 1 or 8 in which said temperature holding is carried out and completed in from 20 minutes to 6 hours.

10. The method of claims 1 or 8 in which said $RFe_x$ alloy is formed from iron and terbium (Tb) together with other rare earth metals selected from the group consisting of dysprosium (Dy), holmium (Ho), or both Dy and Ho.

11. The method of claims 1 or 8 in which said $RFe_x$ alloy is represented by the formula $Tb_xDy_{1-x}Fe_{1.5-2.0}$ wherein x is a number from 0.27 to 0.35.

12. The method of claims 1 or 8 in which said rod is heated to a temperature of 900 to 1000° C.

* * * * *